(12) United States Patent
Root et al.

(10) Patent No.: US 6,963,207 B2
(45) Date of Patent: Nov. 8, 2005

(54) APPARATUS AND METHOD FOR TERMINATING PROBE APPARATUS OF SEMICONDUCTOR WAFER

(75) Inventors: Bryan J. Root, Apple Valley, MN (US); William A. Funk, Eagan, MN (US)

(73) Assignee: Celadon Systems, Inc., Burnsville, MN (US)

( * ) Notice: Subject to any disclaimer, the term of this patent is extended or adjusted under 35 U.S.C. 154(b) by 0 days.

(21) Appl. No.: 10/383,079

(22) Filed: Mar. 6, 2003

(65) Prior Publication Data

US 2004/0174175 A1 Sep. 9, 2004

(51) Int. Cl.⁷ .............................................. G01R 31/02
(52) U.S. Cl. .................... 324/754; 324/761; 324/158.1
(58) Field of Search ................................. 324/754, 765, 324/158.1, 758, 761, 752; 439/482, 700; 29/852, 854

(56) References Cited

U.S. PATENT DOCUMENTS

| | | | |
|---|---|---|---|
| 3,963,986 A | * | 6/1976 | Morton et al. ............... 324/765 |
| 4,480,223 A | | 10/1984 | Aigo |
| 4,731,577 A | | 3/1988 | Logan |
| 4,845,426 A | * | 7/1989 | Nolan et al. ................. 324/760 |
| 5,397,996 A | * | 3/1995 | Keezer ........................ 324/754 |
| 5,525,911 A | * | 6/1996 | Marumo et al. ............. 324/754 |
| 5,729,150 A | | 3/1998 | Schwindt |
| 6,075,376 A | | 6/2000 | Schwindt |
| 6,124,723 A | | 9/2000 | Costello |
| 6,137,302 A | | 10/2000 | Schwindt |
| 6,201,402 B1 | | 3/2001 | Root |
| 6,276,956 B1 | * | 8/2001 | Cook ......................... 439/482 |
| 6,586,954 B2 | | 7/2003 | Root |
| 6,603,322 B1 | * | 8/2003 | Boll et al. ................... 324/754 |
| 2001/0011902 A1 | | 8/2001 | Schwindt |

FOREIGN PATENT DOCUMENTS

| | | |
|---|---|---|
| EP | 0 177 809 | 4/1986 |
| WO | WO 99/04273 | 1/1999 |

* cited by examiner

*Primary Examiner*—Vinh Nguyen
*Assistant Examiner*—Jimmy Nguyen
(74) *Attorney, Agent, or Firm*—Dorsey & Whitney LLP

(57) ABSTRACT

A method and apparatus for terminating a probe that probes a semiconductor device with a signal cable from a tester is provided to connect layers of the probe to layers of the signal cable side by side. The probe and signal cable can be a co-axial or tri-axial probe and signal cable, respectively. A center conductive probe needle of the probe is disposed side by side with and electrically connects to a center signal conductor of the signal cable. A dielectric layer of the probe is disposed side by side with and connects to a dielectric layer of the signal cable. A conductive guard layer of the probe is disposed side by side with and electrically connects to a conductive dispersion/guard layer of the signal cable, and a sleeve of the probe is disposed side by side with and connects to a sleeve of the signal cable. In a tri-axial embodiment, a second dielectric layer of the probe is disposed side by side with and connects to a second dielectric layer of the signal cable.

17 Claims, 7 Drawing Sheets

APPARATUS AND METHOD FOR TERMINATING PROBE APPARATUS OF SEMICONDUCTOR WAFER

CROSS-REFERENCE TO RELATED APPLICATION

None.

FIELD OF THE INVENTION

The present invention relates generally to semiconductor test equipment, and more particularly, to a probe apparatus used in semiconductor test equipment for electrically probing devices on a semiconductor wafer.

BACKGROUND OF THE INVENTION

The semiconductor industry has a need to access many electronic devices on a semiconductor wafer. As the semiconductor industry grows and devices become more complex, many electrical devices, most commonly semiconductor devices, must be electrically tested, for example, for leakage currents and extremely low operating currents. These currents are often below 100 fA. In addition, the currents and device characteristics are often required to be evaluated over a wide temperature range to understand how temperature affects a device. Also, because of materials characteristics of dielectrics, it is often difficult to test characteristics of semiconductor devices in a wide operating temperature range.

To effectively measure at currents below 100 fA (Femto Ampere), a measurement signal must be isolated from external electrical interference, leakage currents through the dielectric material, parasitic capacitance, triboelectric noise, piezoelectric noise, and dielectric absorption, etc.

Accordingly, there is a need for improved semiconductor test equipment for electrically probing semiconductor devices at low currents over a wide temperature range.

SUMMARY OF THE INVENTION

To solve the above and the other problems, the present invention provides a probe apparatus having a probe that probes a semiconductor device and terminates with a signal cable side by side. In one embodiment, the apparatus includes at least one layer of a probe and at least one layer of the signal cable connected side by side.

In one embodiment of the present invention, the probe apparatus includes: a chassis; a dielectric block mounted in the chassis for retaining the probe, the probe extending on the chassis from a proximal end of the probe to the dielectric block, extending through the dielectric block, and projecting from the dielectric block towards the semiconductor device at a distal end of the probe; and a terminating device, mounted on the chassis or dielectric block, for terminating the proximal end of the probe with a distal end of the signal cable side by side.

In one embodiment of the probe apparatus of the present invention, the probe is a co-axial shielded probe which includes: a center conductive probe needle; a dielectric layer surrounding the center conductive probe needle; a conductive guard layer surrounding the dielectric layer; and a non-conductive sleeve which may be heat shrinkable surrounding the conductive guard layer. The signal cable is a co-axial signal cable which includes: a center signal conductor; a dielectric layer surrounding the center signal conductor; a conductive dispersion/guard layer surrounding the dielectric layer; and a non-conductive sleeve which may be heat shrinkable surrounding the conductive dispersion/guard layer. The center conductive probe needle of the shielded probe is disposed side by side with and electrically connects to the center signal conductor of the signal cable. The dielectric layer of the shielded probe is disposed side by side with and connects to the dielectric layer of the signal cable. The conductive guard layer of the shielded probe is disposed side by side with and electrically connects to the conductive dispersion/guard layer of the signal cable. The sleeve of the shielded probe is disposed side by side with and connects to the sleeve of the signal cable.

In an alternative embodiment, the probe is a tri-axial shielded probe which additionally includes a second dielectric layer and a second conductive layer sandwiched between the conductive guard layer and the sleeve of the co-axial shielded probe, and the signal cable is a tri-axial cable which additionally includes a second dielectric layer and a second conductive layer sandwiched between the conductive dispersion/guard layer and the sleeve of the co-axial signal cable. The second dielectric layer of the shielded probe is disposed side by side with and connects to the second dielectric layer of the signal cable. The second conductive layer of the shielded probe is disposed side by side with and electrically connects to the second conductive layer of the signal cable.

Still in one embodiment of the probe apparatus of the present invention, the terminating device includes a shrink tube for shrink-tubing the sleeve of the shielded probe and the sleeve of the signal cable together, for shrink-tubing the conductive guard layer of the shielded probe and the conductive dispersion/guard layer of the signal cable together, for shrink-tubing the dielectric layer of the shielded probe and the dielectric layer of the signal cable together, and for shrink-tubing the center conductive probe needle of the shielded probe and the center signal conductor of the signal cable together. In the alternative embodiment, the shrink tube shrink-tubes the second dielectric layer of the shielded probe and the second dielectric layer of the signal cable together.

Additionally in one embodiment of the present invention, the probe apparatus includes a plate disposed on bottom of the chassis and a cover disposed on top of the chassis. The plate, the chassis, and the cover are made of metal. The plate is electrically isolated from the chassis by a dielectric spacer and separately biased to reduce or minimize parasitic capacitance between the chassis and the semiconductor device. The plate is also a heat shield between the semiconductor device and the chassis to improve test performance and mechanical stability. The cover protects the probe apparatus from mechanical damage contamination, light, and electrical magnetic interference ("EMI") that could disrupt low current measurements, such as measurements below 100 fA.

Further in one embodiment of the present invention, the dielectric block is made of ceramic materials. The dielectric block includes a conduit to retain the shielded probe. The dielectric block may include multiple sites for receiving multiple probes.

Furthermore in one embodiment of the present invention, the probe apparatus includes a purge port disposed on the chassis and a purge tube inserted in the purge port to provide dry air, such as inert gas, in the probe apparatus.

These and other advantages of the present invention will become apparent to those skilled in the art from the following detailed description, wherein it is shown and described illustrative embodiments of the invention, including best modes contemplated for carrying out the invention. As it will be realized, the invention is capable of modifications in various obvious aspects, all without departing from the spirit and scope of the present invention. Accordingly, the drawings and detailed description are to be regarded as illustrative in nature and not restrictive.

DETAILED DESCRIPTION OF THE PREFERRED EMBODIMENTS

Figure 1:
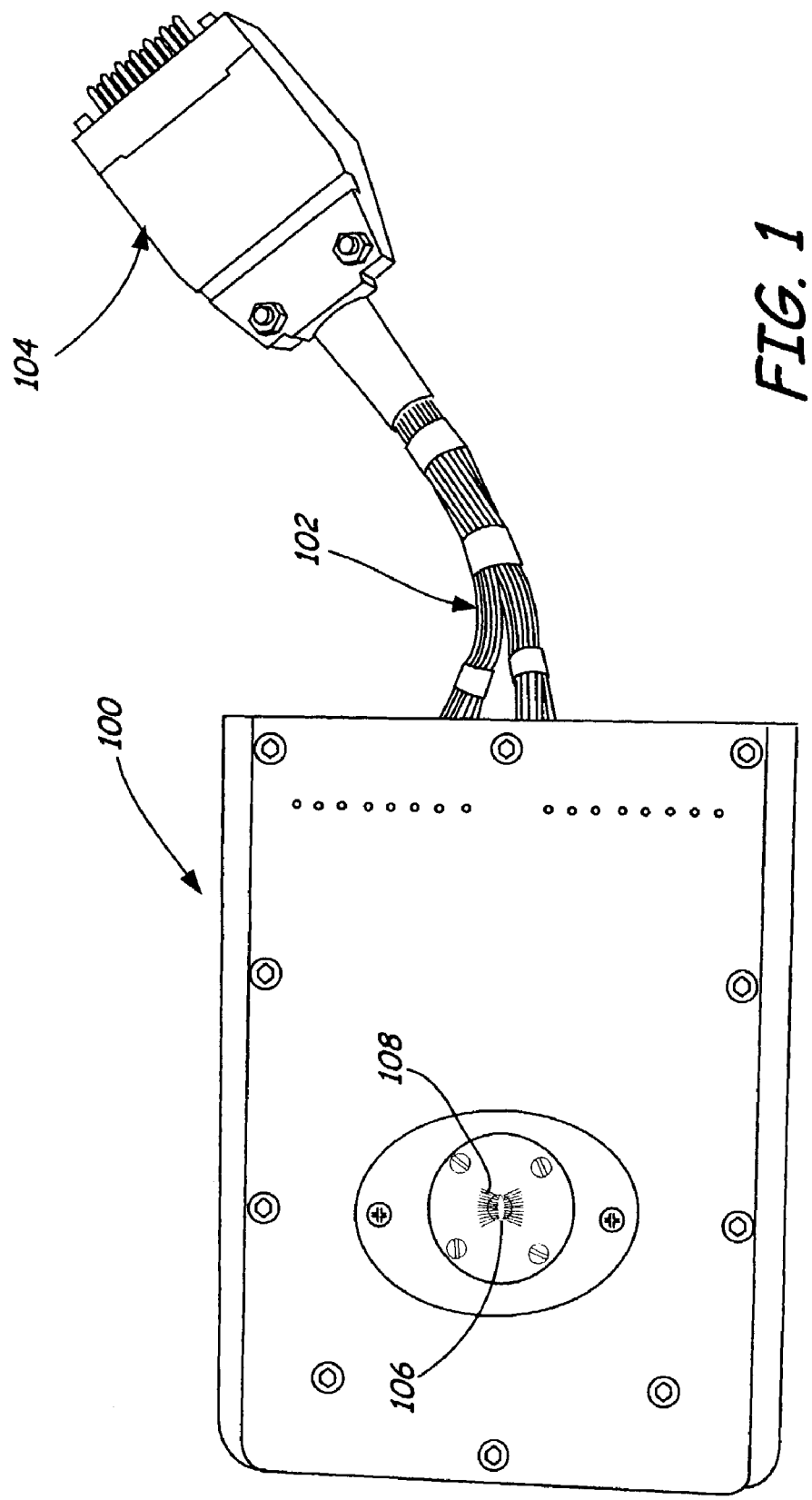
FIG. 1 is a perspective view of a probe apparatus for probing a semiconductor device, in accordance with the principles of the present invention.

In the following description of a preferred embodiment, reference is made to the accompanying drawings, which form a part hereof, and in which is shown by way of illustration a specific embodiment in which the invention may be practiced. It is to be understood that other embodiments may be utilized and structural changes may be made without departing from the scope of the present invention.

For purposes of explanation, numerous specific details are set forth in the following description in order to provide a thorough understanding of the present invention. However, it will be evident to one of ordinary skill in the art that the present invention may be practiced without some of these specific details.

While this invention is susceptible of embodiment in many different forms, there is shown in the drawings and will herein be described in detailed preferred embodiment of the invention with the understanding that the present disclosure is to be considered as an exemplification of the principles of the invention and is not intended to limit the broad aspect of the invention to the embodiment illustrated.

The numerous innovative teachings of the present application will be described with particular reference to the presently preferred embodiments, wherein these innovative teachings are advantageously applied to the particular problems of a probe apparatus or probe card for measuring low currents with a wide operating temperature range in probing a semiconductor device. However, it should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and visa versa with no loss of generality.

The following terms are particularly described throughout the description:

Semiconductor Device Not Limitive

The present invention is particularly suitable for probing semiconductor devices, but the use of the present teachings is not limited to probing semiconductor devices. Other devices may be applied to the present invention teachings. Thus, while this specification speaks in terms of probing 'semiconductor' devices, this term should be interpreted broadly to include probing any suitable device.

Low Current Not Limitive

The present invention solves the problem of measuring currents below 100 fA, but the current range of the present teachings is not limited to below 100 fA. For example, the present invention may be applied to measure the currents at or above 100 fA in a semiconductor device. Thus, while this specification speaks in terms of 'low currents' or 'measuring currents below 100 fA', these terms should be interpreted broadly to include any current that flows through a semiconductor device which could be at or above 100 fA.

Wide Temperature Not Limitive

The present invention solves the problem of measuring currents of a semiconductor device in a narrow or limited operating temperature range. The present teachings do not limit to a specific operating temperature range. The present application allows a tester to electrically probe semiconductor devices over a wide operating temperature range, not only at a low operating temperature but also a high operating temperature, e.g. an operating temperature up to 300 C and beyond. Thus, while this specification speaks in terms of 'wide temperature range' or 'measuring currents in a wide operating temperature range', these terms should be interpreted broadly to include any suitable operating or testing temperature range of a semiconductor device.

Probe Not Limitive

The present invention solves the problem of measuring currents of a semiconductor device using a co-axial or a tri-axial shielded probe. However, nothing in the teachings of the present invention limits application of the teachings of the present invention to a probe with more or less layers. Advantageous use of the teachings of the present invention may be had with a probe of any number of layers.

Signal Cable Not Limitive

The present invention solves the problem of measuring currents of a semiconductor device using a co-axial or a tri-axial signal cable. However, nothing in the teachings of the present invention limits application of the teachings of the present invention to a signal cable with more or less layers. Advantageous use of the teachings of the present invention may be had with a signal cable of any number of layers.

Terminating Device Not Limitive

One skilled in the art will readily realize that the present invention is not limited in scope to a particular terminating device for terminating a probe and a signal cable, such as side by side, or in a switch configuration type, etc. Furthermore, the present invention is not limited to how the terminating device is secured to a chassis of the probe apparatus.

Heat Shrinkable Sleeve and Shrink Tube Method Not Limitive

One skilled in the art will readily realize that the present invention is not limited in scope to a particular method of connecting a signal cable to a shielded probe, for example shrink-tubing, crimping, or clamping, to electrically connect the center conductive probe needle of the shielded probe to the center conductor of the signal cable, to connect the dielectric layer of the shielded probe to the dielectric layer of the signal cable, to electrically connect the guard layer of the shielded probe to the guard layer of the signal cable, and to heat shrink the sleeve of the shielded probe to the sleeve of the signal cable.

Metals Not Limitive

Throughout the discussion herein there will be examples provided that make reference to metals in regards to chassis, cover, and plate. The present invention does not recognize any limitations in regards to what types of metals may be used in affecting the teachings of the present invention. One skilled in the art will recognize that any conductive interconnecting material may be used with no loss of generality in implementing the teachings of the present invention.

Ceramic Not Limitive

Throughout the discussion herein there will be examples provided that make reference to ceramic in regards to dielectric block or tile. The present invention does not recognize any limitations in regards to what types of ceramic may be used in affecting the teachings of the present invention. One skilled in the art will recognize that any non-conductive, highly heat-resistant material may be used with no loss of generality in implementing the teachings of the present invention.

Exemplary Embodiment

As shown in FIG. 1, a probe apparatus 100 of the present invention has a plurality of input and output signal cables 102. The signal cables 102 are attached to a connector 104 that is connected to a test equipment (not shown). The test equipment sends probing signals to a semiconductor device (not shown) via the signal cables 102 and the probe apparatus 100, and/or receives tested signals from the semiconductor device via the probe apparatus 100 and the signal cables 102.

The probe apparatus 100 may include a view port 106. Through the view port 106, a plurality of probes 108 and bond pads 110 (see FIG. 6) can be viewed. The description of probes, bond pads, ceramic tiles, and configurations of a probe card apparatus are disclosed in a pending utility patent application Ser. No. 09/730,130, filed Dec. 4, 2000, which is a Continuation-In-Part ("CIP") patent application Ser. No. 09/021,631, filed Feb. 10, 1998, which are incorporated herewith by reference.

Figure 2:
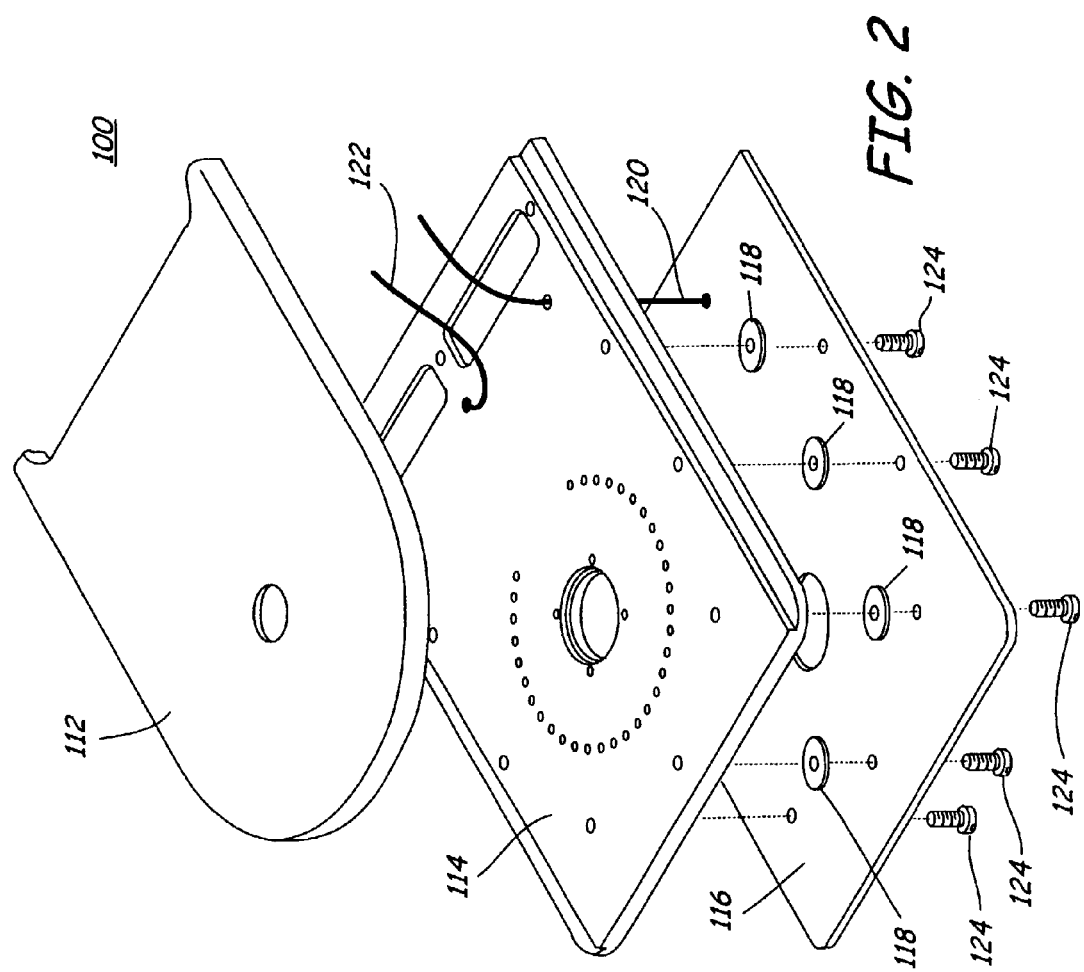
FIG. 2 is an exploded view of a probe apparatus having a cover, chassis, and plate, with shielded probes and signal cables being removed, in accordance with the principles of the present invention.

FIG. 2 illustrates the probe apparatus 100 having a cover 112, a chassis 114, and a plate 116, wherein probes and signal cables are removed. The chassis 114 is made of metal, for example, aluminum or stainless steel or a nickel alloy, etc. The chassis 114 is covered between the cover 112 and the plate 116 both made of metal. The plate 116 is electrically isolated from the chassis 114 by a plurality of dielectric spacers 118 and separately biased to reduce or minimize parasitic capacitance between the chassis 114 and a semiconductor wafer or chuck (not shown). A coaxial connection 120 is provided to individually bias the plate 116 with a voltage potential equal to that of a guard on a semiconductor wafer or chuck (not shown), and the chassis 114 is grounded by a ground cable 122, such that the plate 116 provides a parasitic capacitance shield for the semiconductor device under test. The plate 116 and the dielectric spacers 118 also form a heat shield to isolate the semiconductor device and the chassis 114 from external heat thereby significantly improving test performance.

A plurality of screws 124, such as flat head cap screws, may be included to fasten the cover 112, the chassis 114, the plate 116, and the dielectric spacers 118 together.

The cover 112 is disposed on top of the chassis 114. The cover 112 protects the probe apparatus 100 from mechanical damage contamination, light, and electrical magnetic interference ("EMI") that could disrupt low current measurements, such as measurements below 100 fA.

Figure 3:
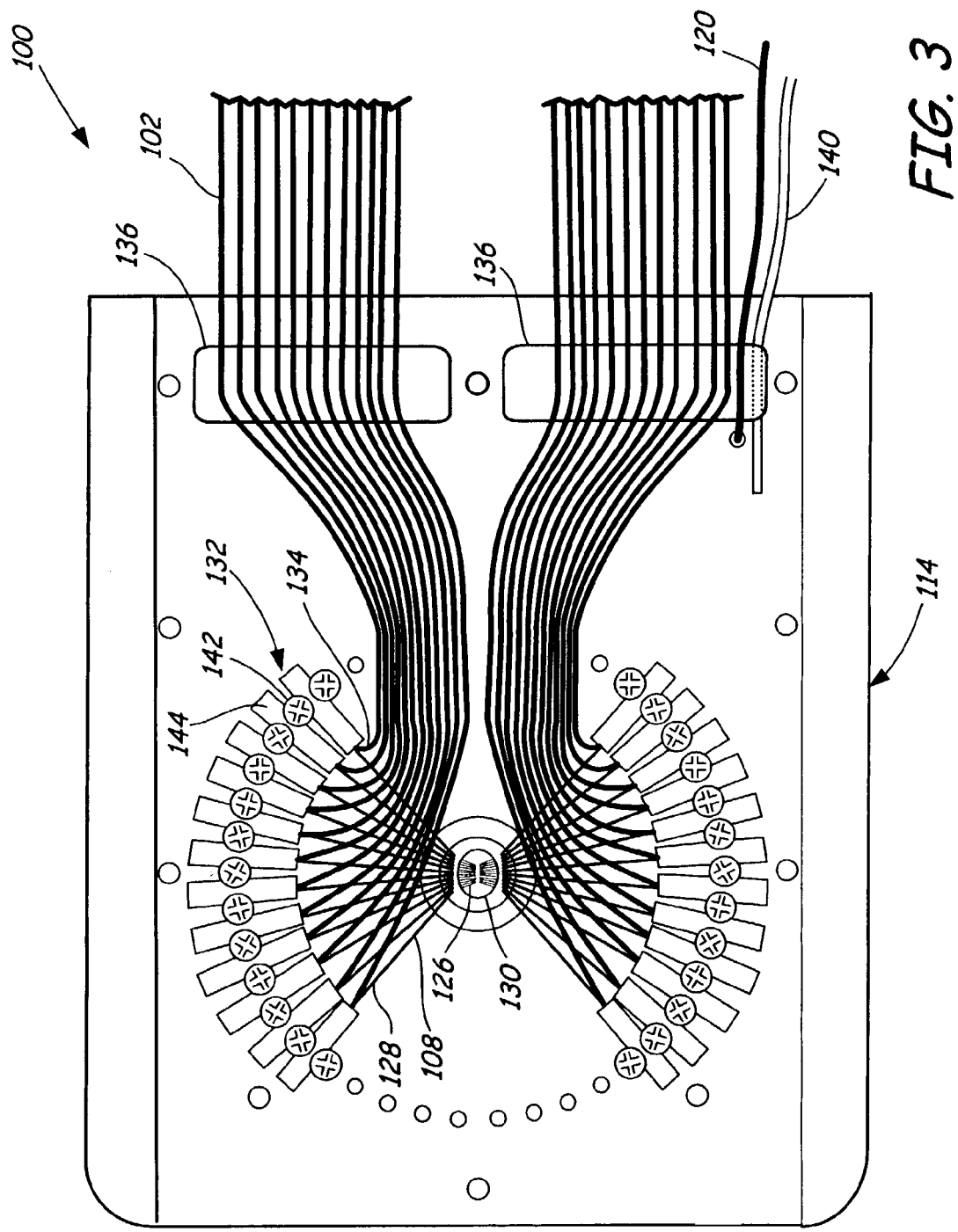
FIG. 3 is a top plan view of the chassis of the probe apparatus with the shielded probes and the signal cables terminated on the chassis, in accordance with the principles of the present invention.
Figure 4:
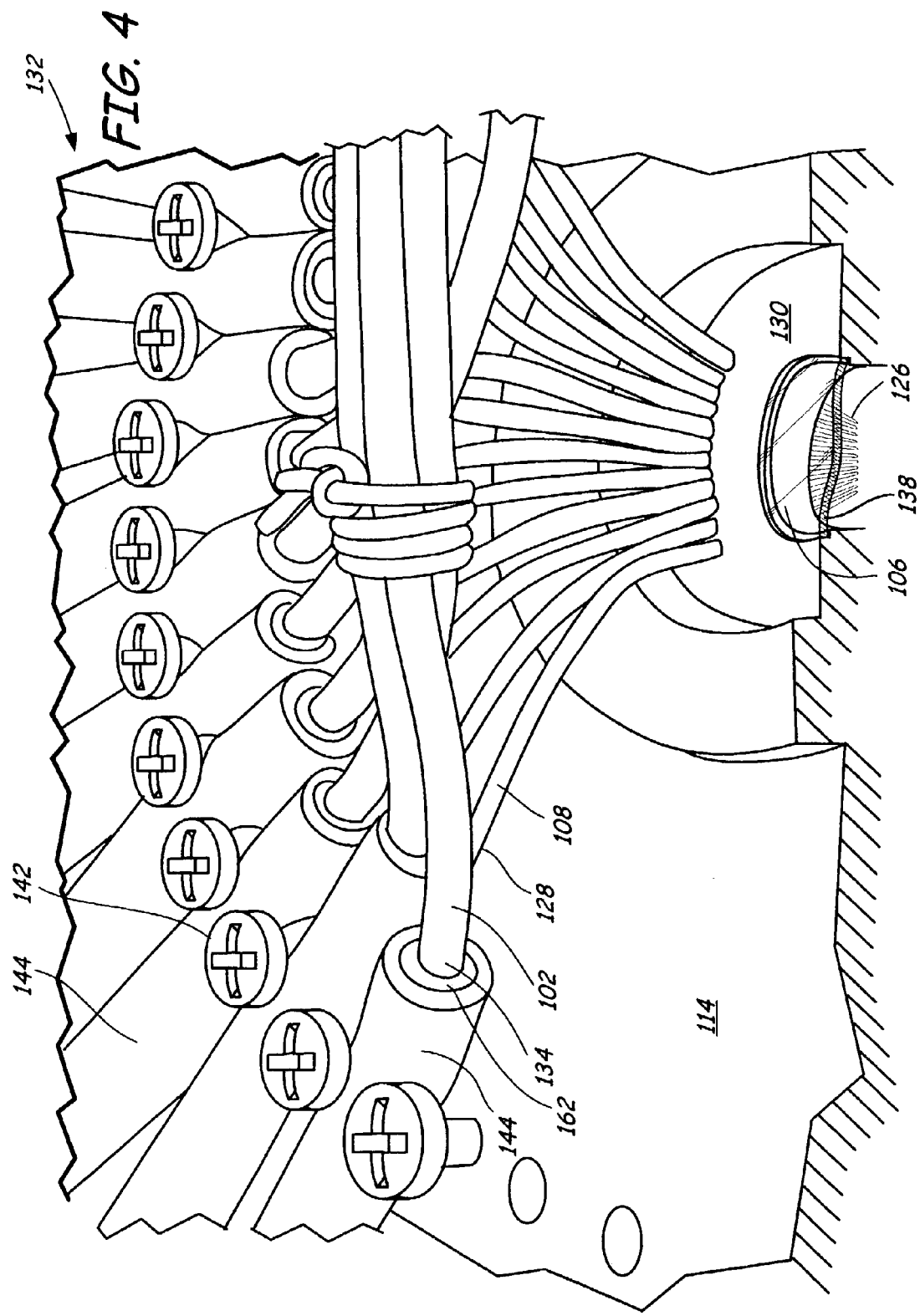
FIG. 4 is an enlarged perspective view of the shielded probes being inserted into a dielectric block and terminated with the signal cables at a terminating device, in accordance with the principles of the present invention.

FIGS. 3–4 illustrate the chassis 114 of the probe apparatus 100 with the probes 108 and the signal cables 102 terminated by a terminating device 132 on the chassis 114. The probe 108 probes a semiconductor device (not shown) at a distal end 126 of the probe 108 and terminates with the signal cable 102 at a proximal end 128 of the probe 108. The probe apparatus 100 includes a dielectric block 130 mounted in the chassis 114 for retaining the probe 108. The probe 108 extends on the chassis 114 from the proximal end 128 of the probe 108 to the dielectric block 130, extending through the dielectric block 130 and projecting from the dielectric block 130 towards the semiconductor device at the distal end 126 of the probe 108.

The terminating device 132 is mounted on the chassis 114 for terminating the proximal end 128 of the probe 108 with a distal end 134 of the signal cable 102 side by side. As shown in FIGS. 3 and 4, the terminating device 132 includes a screw 142 and a strain relief 144. The screw 142, such as a pan head screw, may be included to hold the strain relief 144 onto the chassis 114 in place. The strain relief 144 is made of silicon rubber sheet or the like. A shrink-tube 162 is disposed inside the strain relief 144 to shrink-tube the proximal end 128 of the probe 108 and the distal end 134 of the signal cable 102 side by side together.

Also shown in FIG. 3, a cavity 136 disposed on the chassis 114 may be included to hold the signal cable 102 in place with a cable strain relief (not shown). Further, a purge tube 140 may be inserted through the cable strain relief into the chassis 114 to provide dry air, such as inert gas, e.g. dry nitrogen, in the probe apparatus 100.

Also shown in FIG. 4, a glass lens 138 may be mounted on the dielectric block 130 to cover the view hole 106 so as to keep the dry air from flowing into a probe test area. Thus, the operating temperature in the probe test area is not affected by the dry air which is typically in a cold temperature.

Figure 5:
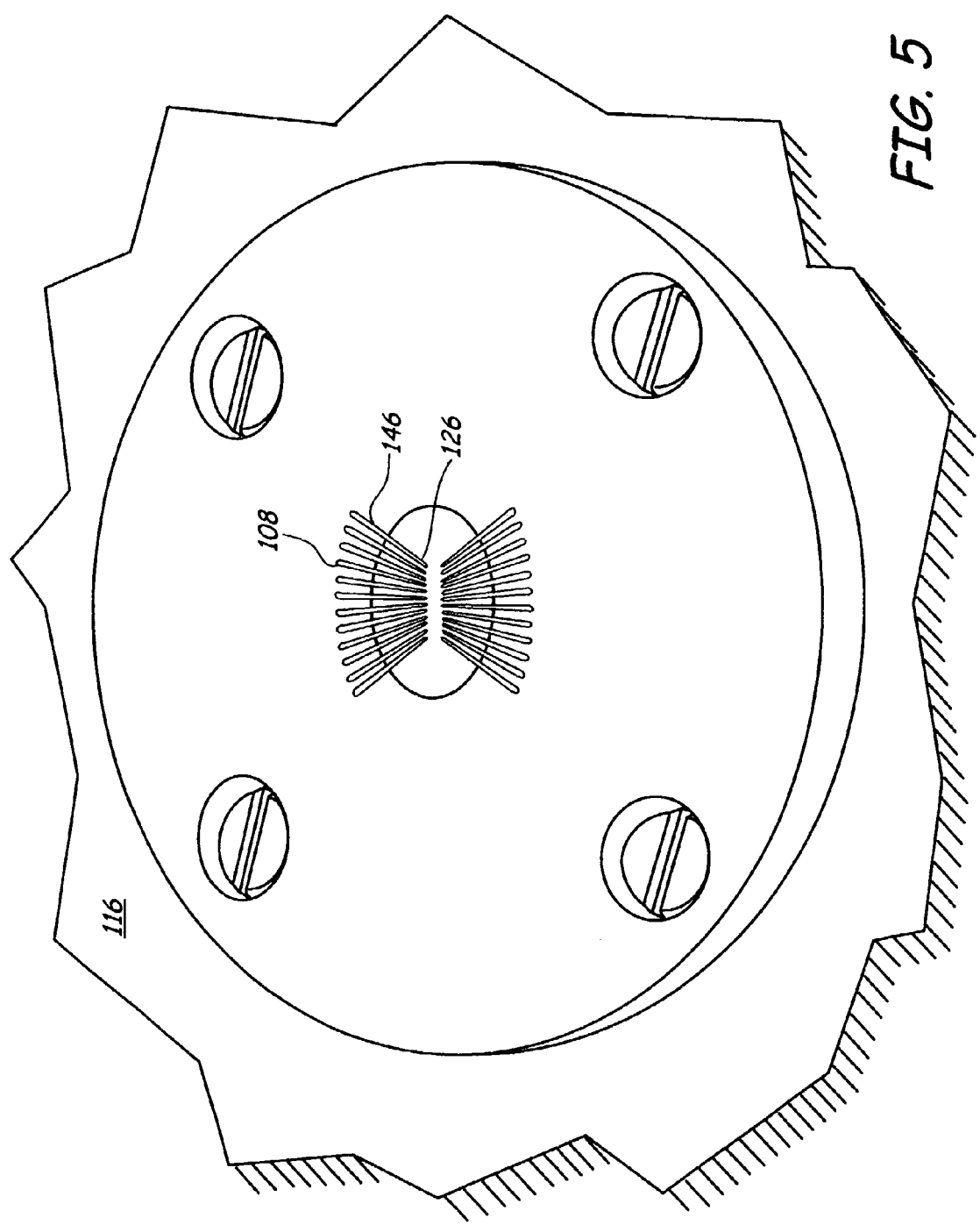
FIG. 5 is an enlarged bottom view of the plate of the probe apparatus with a plurality of probe needles of the shielded probes, in accordance with the principles of the present invention.

FIG. 5 illustrates a bottom plan view of the plate 116 of the probe apparatus 100 with a plurality of probe needles 146 of the probes 108 extending out of the dielectric block. The details of how the probes extend in, through, and out of the dielectric block are disclosed in a pending utility patent application Ser. No. 09/730,130, filed Dec. 4, 2000, which is a Continuation-In-Part ("CIP") patent application Ser. No. 09/021,631, filed Feb. 10, 1998, which are incorporated herewith by reference.

In the embodiments of the probe apparatus 100 as shown in FIGS. 3 and 4, the probe 108 can be a co-axial probe or a tri-axial probe, and the signal cable 102 can be a co-axial signal cable or a tri-axial signal cable. It will be appreciated that the probe and the signal cable may include additional layers without departing from the principles of the present invention.

Figure 6:
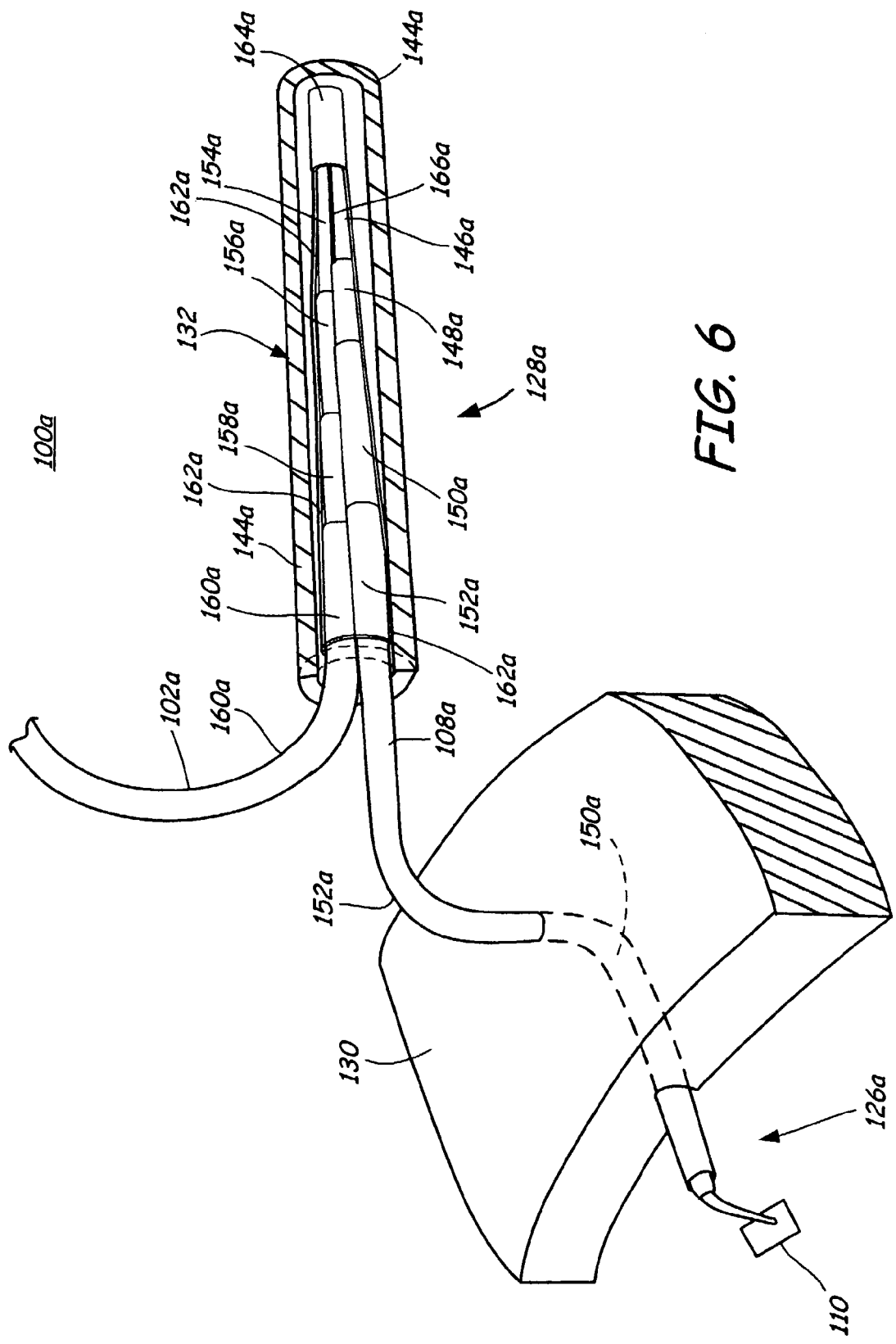
FIG. 6 is a perspective view of the probe apparatus having a co-axial shielded probe terminating with a co-axial signal cable at a terminating device, in accordance with the principles of the present invention.

FIG. 6 illustrates the probe apparatus 100 having a co-axial shielded probe 108*a* terminating with a co-axial signal cable 102*a* at the terminating device 132. The shielded probe 108*a* includes a center conductive probe needle 146*a*, a dielectric layer 148*a* surrounding the center conductive probe needle 146*a*, a conductive guard layer 150*a* surrounding the dielectric layer 148*a*, a non-conductive heat-shrinkable sleeve 152*a* surrounding the conductive guard layer 150*a*. The signal cable 102*a* includes a center signal conductor 154*a*, a dielectric layer 156*a* surrounding the center signal conductor 154*a*, a conductive dispersion/guard layer 158*a* surrounding the dielectric layer 156*a*, and a non-conductive heat-shrinkable sleeve 160*a* surrounding the conductive dispersion/guard layer 158*a*.

At a distal end 126*a*, the shielded probe 108*a* extends from the dielectric block 130 toward the bond pad 110. The sleeve 152*a* is removed when it is inserted into the dielectric block 130.

As shown in FIG. 6, at the proximal end 128*a*, the center conductive probe needle 146*a* of the shielded probe 108*a* is disposed side by side with and electrically connects to the center signal conductor 154*a* of the signal cable 102*a*. The dielectric layer 148*a* of the shielded probe 108*a* is disposed side by side with and connects to the dielectric layer 156*a* of the signal cable 102*a*. The conductive guard layer 150*a* of the shielded probe 108*a* is disposed side by side with and electrically connects to the conductive dispersion/guard layer 158*a* of the signal cable 102*a*. The sleeve 152*a* of the shielded probe 108*a* is disposed side by side with and connects to the sleeve 160*a* of the signal cable 102*a*.

As shown in FIG. 6, the terminating device 132 includes a shrink tube 162*a* for shrink-tubing the sleeve 152*a* of the shielded probe 108*a* and the sleeve 160*a* of the signal cable 102*a* together, for shrink-tubing the conductive guard layer 150*a* of the shielded probe 108*a* and the conductive dispersion/guard layer 158*a* of the signal cable 102*a* together, for shrink-tubing the dielectric layer 148*a* of the shielded probe 108*a* and the dielectric layer 156*a* of the signal cable 102*a* together, and for shrink-tubing the center conductive probe needle 146*a* of the shielded probe 108*a* and the center signal conductor 154*a* of the signal cable 102*a* together. The shrink tube 162*a* is covered by the strain relief 144*a*.

An extension 164*a* of the shrink tube 162*a* is disposed at an end of the center conductive probe needle 146*a* and the center signal conductor 154*a*, and is configured sufficiently wide enough to prevent electrical current from leaking from the center conductive probe needle 146*a* and the center signal conductor 154*a* to the strain relief 144*a*. In addition, the center conductive probe needle 146*a* and the center signal conductor 154*a* may be soldered, brazed, welded, crimped, or snuggled therebetween at 166*a* to provide additional clearance between the center conductive probe needle 146*a* and the strain relief 144*a*, and additional clearance between the center signal conductor 154*a* and the strain relief 144*a*.

Figure 7:
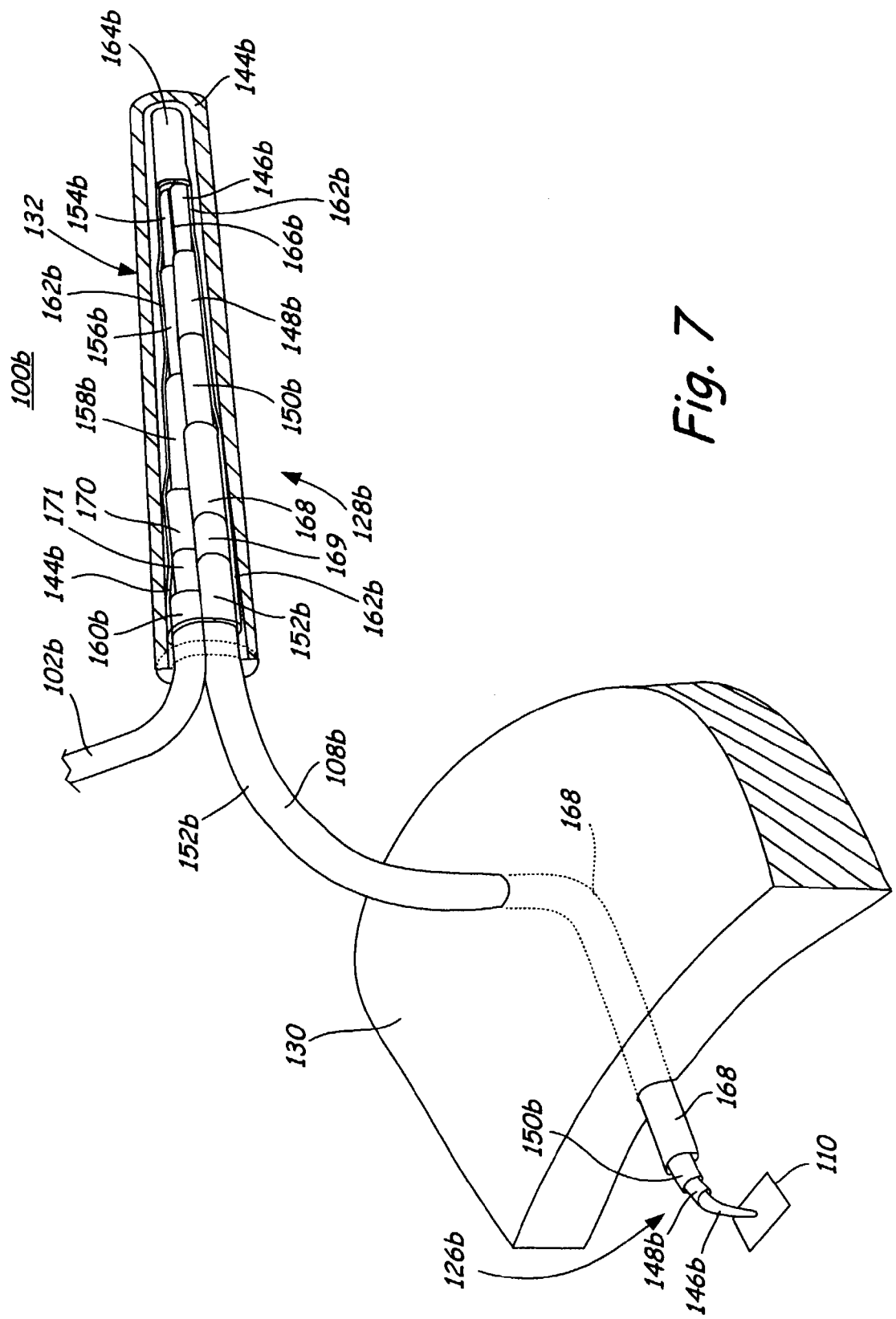
FIG. 7 is a perspective view of the probe apparatus having a tri-axial shielded probe terminating with a tri-axial signal cable at a terminating device, in accordance with the principles of the present invention.

FIG. 7 illustrates the probe apparatus 100 having a tri-axial shielded probe 108*b* terminating with a tri-axial signal cable 102*b* at the terminating device 132. The tri-axial shielded probe 108*b* additionally includes a second dielectric layer 168 sandwiched between a conductive guard layer 150*b* and the sleeve 152*b*. A guard layer 169 may be included between the second dielectric layer 168 and the sleeve 152*b*. The signal cable 102*b* additionally includes a second dielectric layer 170 sandwiched between the conductive dispersion/guard layer 158*b* and the sleeve 160*b*. A guard layer 171 may be included between the second dielectric layer 171 and the sleeve 160*b*. Accordingly, as shown in FIG. 7, the shielded probe 108*b* includes a center conductive probe needle 146*b*, a dielectric layer 148*b* surrounding the center conductive probe needle 146*b*, the conductive guard layer 150*b* surrounding the dielectric layer 148*b*, the second dielectric layer 168 surrounding the conductive guard layer 150*b*, the guard layer 169 surrounding the second dielectric layer 168, and the sleeve 152*b* surrounding the guard layer 169. The signal cable 102*b* includes a center signal conductor 154*b*, a dielectric layer 156*b* surrounding the center signal conductor 154*b*, the conductive dispersion/guard layer 158*b* surrounding the dielectric layer 156*b*, the second dielectric layer 170 surrounding the conductive dispersion/guard layer 158*b*, the guard layer 171 surround the second dielectric layer 170, and the sleeve 160*b* surrounding the guard layer 171.

At a distal end 126*b*, the shielded probe 108*b* extends from the dielectric block 130 toward the bond pad 110. The sleeve 152*b* is removed when it is inserted into the dielectric block 130.

As shown in FIG. 7, at the proximal end 128*b*, the center conductive probe needle 146*b* of the shielded probe 108*b* is disposed side by side with and electrically connects to the center signal conductor 154*b* of the signal cable 102*b*. The dielectric layer 148*b* of the shielded probe 108*b* is disposed side by side with and connects to the dielectric layer 156*b* of the signal cable 102*b*. The conductive guard layer 150*b* of the shielded probe 108*b* is disposed side by side with and electrically connects to the conductive dispersion/guard layer 158*b* of the signal cable 102*b*. The second dielectric layer 168 of the shielded probe 108*b* is disposed side by side with and connects to the second dielectric layer 170 of the signal cable 102*b*. The guard layer 169 of the shielded probe 108*b* is disposed side by side with and electrically connects to the guard layer 171 of the signal cable 102*b*. The sleeve 150*b* of the shielded probe 108*b* is disposed side by side with and connects to the sleeve 160*b* of the signal cable 102*b*.

As shown in FIG. 7, the terminating device 132 includes a shrink tube 162*b* for shrink-tubing the sleeve 152*b* of the shielded probe 108*b* and the sleeve 160*b* of the signal cable 102*b* together, for shrink-tubing the second dielectric layer 168 of the shielded probe 108*b* and the second dielectric layer 170 of the signal cable 102*b* together, for shrink-tubing the conductive guard layer 150*b* of the shielded probe 108*b* and the conductive dispersion/guard layer 158*b* of the signal cable 102*b* together, for shrink-tubing the guard layer 169 of the shielded probe and the guard layer 171 of the signal cable 102*b*, for shrink-tubing the dielectric layer 148*b* of the shielded probe 108*b* and the dielectric layer 156*b* of the signal cable 102*b* together, and for shrink-tubing the center conductive probe needle 146*b* of the shielded probe 108*b* and the center signal conductor 154*b* of the signal cable 102*b* together. The shrink tube 162*b* is covered by the strain relief 144*b*.

An extension 164*b* of the shrink tube 162*b* is disposed at an end of the center conductive probe needle 146*b* and the center signal conductor 154*b*, and is configured sufficiently wide enough to prevent electrical current from leaking from the center conductive probe needle 146*b* and the center signal conductor 154*b* to the strain relief 144*b*. In addition, the center conductive probe needle 146*b* and the center signal conductor 154*b* may be soldered, brazed, welded, crimped, or snuggled therebetween at 166*b* to provide additional clearance between the center conductive probe needle 146a and the strain relief 144b, and additional clearance between the center signal conductor 154a and the strain relief 144b.

The probe needle is preferably made of metal, such as Tungsten (W). The dielectric layer is preferably a high operating temperature polymer. The shrink-tube is preferably made of PTFE materials. The dielectric block is preferably made of ceramic materials and may include multiple sites for receiving multiple probes. The dielectric block may or may not have openings to view the tips of probe needles.

As described above, each probe is attached to a high operating temperature, low triboelectric noise signal cable to facilitate connection to electronic testing and equipment measurement. To terminate the probe apparatus 100, the signal cable is connected to the probe by stripping back the sleeves of the probe and signal cable, placing the proximal end of the probe along side the distal end of the signal cable and shrinking the sleeves. Crimping and/or clamping methods can also be used to terminate the signal cable with the probe. Ultra high temperature solders may be added between the end of the center signal conductor and the end of the probe needle to firmly join the ends. Alternatively, the probe needle can be brazed onto the center signal conductor to join the ends.

In one embodiment of the dispersion/guard layer of the signal cable, a guard braid covers the entire dispersion layer of the signal cable. In an alternative embodiment, a guard braid is peeled back and partially removed to expose the conductive dispersion/guard layer of the signal cable. The conductive dispersion/guard layer is held against the conductive guard braid of the probe by the force of the shrink tube, thereby eliminating the possibility of the guard braid piercing the probe's conductive guard layer and the polymer-coated dielectric layer and creating an electrical short circuit between the center conductive probe needle and the conductive guard layer of the probe.

The shrink-tube assembly is encased in the protective strain relief and anchored to the chassis. The protective strain relief is preferably a silicone rubber tube. The shrink tube is surrounded by the strain relief. The strain relief and the shrink tube are slipped over the sleeves of the probe and signal cable to suspend the unguarded but shrink-tubed tips of the probe and signal cable in air, thereby eliminating any current leakage paths. The signal cables for each probe needle are then routed outside the chassis through a second strain relief mounted on the chassis. The coaxial or tri-axial signal cable with the sleeve extended into the chassis can also be used to reduce cross talk.

The conductive metal cover is placed on the metal chassis to protect and shield the assembly from mechanical damage contamination, light, and electro-magnetic interference ("EMI") that could disrupt the low current measurements. An electrically isolated plate is placed on the bottom of the chassis and separately biased to reduce or minimize any parasitic capacitance of the probe apparatus.

From the above description and drawings, it will be understood by those of ordinary skill in the art that the particular embodiments shown and described are for purposes of illustration only and are not intended to limit the scope of the present invention. Those of ordinary skill in the art will recognize that the present invention may be embodied in other specific forms without departing from its spirit or essential characteristics. References to details of particular embodiments are not intended to limit the scope of the invention.

What is claimed is:

1. A probe apparatus for probing a semiconductor device by a tester, comprising:
    a probe probing the semiconductor device;
    a signal cable connecting to the tester and the probe and conducting a probe signal between the probe and the tester;
    a chassis;
    a dielectric block mounted in the chassis for retaining the probe, the probe extending along the chassis and into the dielectric block, and projecting from the dielectric block towards the semiconductor device at a distal end of the probe; and
    a terminating device mounted on the chassis for terminating the proximal end of the probe with a distal end of the signal cable side by side, whereby the probe and the signal cable are disposed side by side and electrically connected therebetween.

2. The apparatus of claim 1, wherein the probe is a co-axial shielded probe which comprises:
    a center conductive probe needle;
    a dielectric layer surrounding the center conductive probe needle;
    a conductive guard layer surrounding the dielectric layer; and
    a sleeve surrounding the conductive guard layer.

3. The apparatus of claim 2, wherein the signal cable is a co-axial signal cable which comprises:
    a center signal conductor;
    a dielectric layer surrounding the center signal conductor;
    a conductive dispersion/guard layer surrounding the dielectric layer; and
    a sleeve surrounding the conductive dispersion/guard layer.

4. The apparatus of claim 3, wherein the center conductive probe needle of the shielded probe is disposed side by side with and electrically connects to the center signal conductor of the signal cable, the dielectric layer of the shielded probe is disposed side by side with and connects to the dielectric layer of the signal cable, the conductive guard layer of the shielded probe is disposed side by side with and electrically connects to the conductive dispersion/guard layer of the signal cable, and the sleeve of the shielded probe is disposed side by side with and connects to the sleeve of the signal cable.

5. The apparatus of claim 1, wherein the probe is a tri-axial shielded probe which comprises:
    a center conductive probe needle;
    a dielectric layer surrounding the center conductive probe needle;
    a conductive guard layer surrounding the dielectric layer;
    a second dielectric layer surrounding the conductive guard layer;
    a guard layer surrounding the second dielectric layer; and
    a sleeve surrounding the guard layer.

6. The apparatus of claim 5, wherein the signal cable is a tri-axial signal cable which comprises:
    a center signal conductor;
    a dielectric layer surrounding the center signal conductor;
    a conductive dispersion/guard layer surrounding the dielectric layer;
    a second dielectric layer surrounding the conductive dispersion/guard layer;
    a guard layer surrounding the second dielectric layer; and
    a sleeve surrounding the guard layer.

7. The apparatus of claim 6, wherein the center conductive probe needle of the shielded probe is disposed side by side with and electrically connects to the center signal conductor of the signal cable, the dielectric layer of the shielded probe is disposed side by side with and connects to the dielectric layer of the signal cable, the conductive guard layer of the shielded probe is disposed side by side with and electrically connects to the conductive dispersion/guard layer of the signal cable, the second dielectric layer of the shielded probe is disposed side by side with and connects to the second dielectric layer of the signal cable, the guard layer of the shielded probe is disposed side by side with and electrically connects to the guard layer of the signal cable; and the sleeve of the shielded probe is disposed side by side with and connects to the sleeve of the signal cable.

8. The apparatus of claim 4, wherein the terminating device comprises a shrink tube for shrink-tubing the shielded probe and the signal cable.

9. The apparatus of claim 7, wherein the terminating device comprises a shrink tube for shrink-tubing the shielded probe and the signal cable.

10. The apparatus of claim 1, further comprising:
a plate disposed on bottom of the chassis;
a cover disposed on top of the chassis;
a dielectric spacer disposed between the chassis and the plate such that the plate is electrically isolated from the chassis and separately biased to minimize parasitic capacitance between the chassis and the semiconductor device.

11. The apparatus of claim 10, wherein the plate is a heat shield for the semiconductor device and the chassis to improve test performance, and the cover is a shield for protecting the probe apparatus from interference that could disrupt measurements below 100 fA.

12. The apparatus of claim 1, wherein the dielectric block is made of ceramic which comprises a conduit to retain the probe.

13. The apparatus of claim 12, wherein the dielectric block comprises a plurality of sites for receiving a plurality of probes.

14. The apparatus of claim 12, further comprising:
a purge tube inserted into the chassis to provide purge air in the probe apparatus.

15. The apparatus of claim 14, further comprising a glass lens mounted on the dielectric block to prevent the purge air from cooling the semiconductor device.

16. An apparatus for terminating a probe that probes a semiconductor device with a signal cable from a tester, the apparatus comprising:
at least one layer of the probe;
at least one layer of the signal cable disposed side by side and electrically connected therebetween; and
a shrink tube for shrink-tubing the probe and the signal cable;
wherein the probe comprises:
a center conductive probe needle;
a dielectric layer surrounding the center conductive probe needle;
a conductive guard layer surrounding the dielectric layer; and
a sleeve surrounding the conductive guard layer;
wherein the signal cable comprises:
a center signal conductor;
a dielectric layer surrounding the center signal conductor;
a conductive dispersion/guard layer surrounding the dielectric layer; and
a sleeve surrounding the conductive dispersion/guard layer; and
wherein the center conductive probe needle of the probe is disposed side by side with and electrically connects to the center signal conductor of the signal cable, the dielectric layer of the probe is disposed side by side with and connects to the dielectric layer of the signal cable, the conductive guard layer of the probe is disposed side by side with and electrically connects to the conductive dispersion/guard layer of the signal cable, and the sleeve of the probe is disposed side by side with and connects to the sleeve of the signal cable.

17. The apparatus of claim 16, wherein the probe further comprises a second dielectric layer, and the signal cable further comprises a second dielectric layer, wherein the second dielectric layer of the probe is disposed side by side with and connects to the second dielectric layer of the signal cable.

* * * * *